United States Patent [19]
Nomura et al.

[11] Patent Number: 6,142,307
[45] Date of Patent: Nov. 7, 2000

[54] PACKING SYSTEM OF ELECTRONIC COMPONENTS

[75] Inventors: Katsumi Nomura; Masao Ukita; Yoshio Mikami, all of Yamaguchi, Japan

[73] Assignee: Matsushita Electric Industrial Co., Ltd., Osaka, Japan

[21] Appl. No.: 09/271,225

[22] Filed: Mar. 17, 1999

[30] Foreign Application Priority Data

Mar. 17, 1998 [JP] Japan ..................................... 10-66603

[51] Int. Cl.⁷ .................................................. B65D 73/02
[52] U.S. Cl. ........................................... 206/714; 206/725
[58] Field of Search ............................... 206/330, 459.5, 206/713, 714, 715, 723, 725

[56] References Cited

U.S. PATENT DOCUMENTS

| | | | |
|---|---|---|---|
| 3,497,058 | 2/1970 | Walket et al. | 206/723 |
| 4,633,370 | 12/1986 | Hamuro et al. | 206/714 |
| 4,702,370 | 10/1987 | Honda . | |
| 4,753,003 | 6/1988 | Gobeil | 206/330 |
| 5,119,934 | 6/1992 | Karasawa et al. . | |
| 5,265,723 | 11/1993 | Chenoweth et al. | 206/714 |
| 5,447,784 | 9/1995 | Williams et al. . | |
| 5,469,962 | 11/1995 | Kitagawa et al. | 206/725 |
| 5,494,168 | 2/1996 | Hart . | |
| 5,690,233 | 11/1997 | Kaneko | 206/714 |

FOREIGN PATENT DOCUMENTS

| | | | |
|---|---|---|---|
| 2-219760 | 9/1990 | Japan | 206/330 |
| 4-18263 | 1/1992 | Japan | 206/330 |
| 5-65171 | 3/1993 | Japan | 206/330 |
| 5-213365 | 8/1993 | Japan | 206/330 |

*Primary Examiner*—David T. Fidei
*Attorney, Agent, or Firm*—Ratner & Prestia

[57] ABSTRACT

An electronic components packing system includes a base packing material provided with body containing portions for containing the bodies of electronic components, and lead wire containing portions, formed at respective body containing portions, for containing lead wires extending from the respective bodies of electronic components. A top tape is attached on the top of the base packing material preventing electronic components contained in the base packing material from bouncing out. This packing system maintains electronic components in such a manner that the positions of respective electronic components are fixed so that the electronic components do not touch each other.

33 Claims, 5 Drawing Sheets

6,142,307

PACKING SYSTEM OF ELECTRONIC COMPONENTS

FIELD OF THE INVENTION

The present invention relates to a packing system of electronic components having draw-out lead wires.

BACKGROUND OF THE INVENTION

The following is an explanation of a conventional packing system of electronic components. An aluminum electrolytic capacitor (hereinafter referred to as a capacitor) serves having draw out lead wires as an example of electronic component.

FIG. 7 is a partial cross sectional front view showing the structure of a capacitor. In FIG. 7, a case 16 contains capacitor elements (not illustrated), and a sheathing sleeve 17 covers the circumference of case 16. Case 16 containing the capacitor elements and sheathing sleeve 17 comprise the body of the capacitor. Lead wires 18 are drawn out from the body of the capacitor.

FIG. 8 shows the state of conventional packing of the capacitors of the type illustrated in FIG. 7. In FIG. 8, a polyethylene bag 19 contains a plurality of capacitors in bulk. In a conventional packing system, a plurality of bags such as bag 19, containing a predetermined number of capacitors, are included in a packing box (not illustrated).

In the conventional packing system described above, as a plurality of the capacitors are contained in bag 19 in bulk, it is difficult to fix the positions of capacitors and the positions of bags (such as bag 19) containing the capacitors in the packing box. Consequently, during the packing process and transport, lead wires 18 of one capacitor may touch a body and lead wires 18 of other capacitors. Hence, lead wires 18 of some capacitors may become deformed, while sheathing sleeves 17 and cases 16 of other capacitors may be scratched.

Also, there is another problem that much of the packing process such as inserting a plurality of capacitors into bag 19 made of thin polyethylene film, is performed manually because automating the packing process using such a bag is difficult.

SUMMERY OF THE INVENTION

The present invention aims to provide an electronic components packing system with which the reliability is improved by preventing the deformation of lead wires of electronic components and the scratches on the sheathing sleeves and the cases of the electronic components. Further, the packing process of electronic components of the present invention may be easily automated.

An electronic components packing system of the present invention includes a base packing material provided with body containing portions for containing the bodies of the electronic components, and lead wire containing portions, formed at respective body containing portions, for containing lead wires drawn out from respective bodies of the electronic components. A top tape is attached on the top of the base packing material preventing electronic components contained in the base packing material from bouncing out.

With the structure described above, electronic components are contained in such a manner that the positions of respective electronic components are fixed so that the electronic components do not touch each other. Consequently, the deformation of lead wires and scratching of sheathing sleeves and cases are mostly prevented. Also, as lead wires drawn out from electronic components are securely positioned, electronic components may not move in the body containing portions. Thus, a highly reliable packing process, transport and storage of electronic components may be realized.

DESCRIPTION OF THE PREFERRED EMBODIMENTS

Figure 1A:
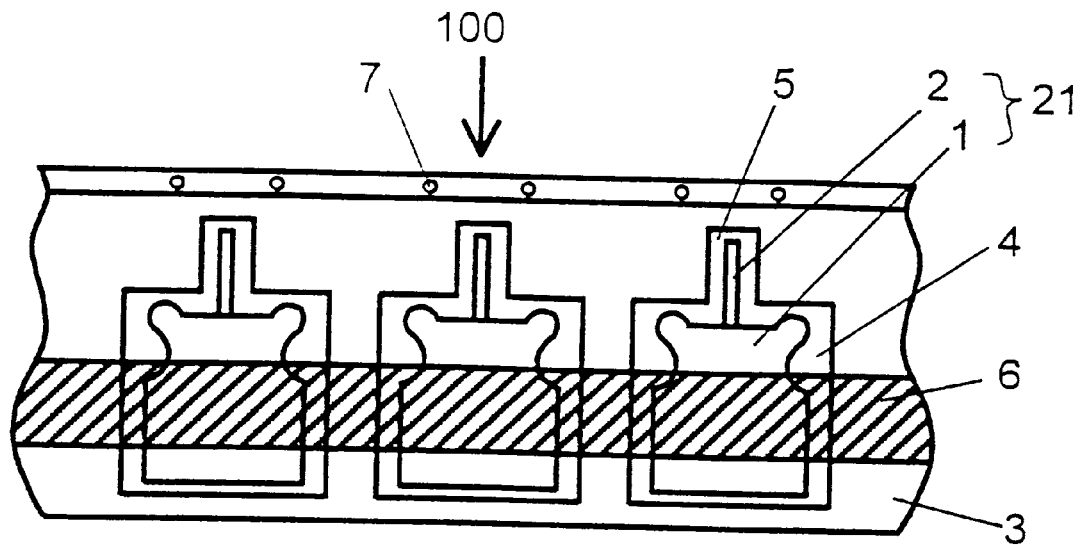
FIG. 1A is a plan view showing a packing system in which capacitors are contained in a base packing material and a top tape is attached according to a first exemplary embodiment of the present invention.

In the following, explanations of the exemplary embodiments of the present invention are described referring to the drawings, in which a capacitor is given as an example of an electronic component.

First Exemplary Embodiment

In the following, an explanation of a first exemplary embodiment of the present invention is described referring to FIGS. 1A, 1B and FIG. 2. Lead wires 2 are drawn out from a body 1 of a capacitor 21. A base packing material 3 is provided with body containing portions 4 for containing bodies, such as body 1, of capacitors, such as capacitor 21, and lead wire containing portions 5, protruded from the respective body containing portions 4, for containing the lead wires 2. Then a top tape 6 is attached at the top of base packing material 3 for preventing the bouncing out of capacitors, such as capacitor 21, contained in base packing material 3.

Base packing material 3 is formed, by forming cavities for body containing portions 4 and for lead wire containing portions 5, for example, by vacuum forming on a material in plate shape. For the material of the base packing material 3, paper or a resin sheet may be preferably used. Regarding a resin sheet, it may be desirable to use a sheet made of polystyrene or the like which does not generate harmful gas at incineration, from the standpoint of being friendly to environment, which is a recent topic.

Also, by forming a plurality of body containing portions 4 having respective lead wire containing portions 5 sequentially at intervals of a predetermined spacing provided in base packing material 3, the yield of packing materials and the work efficiency of a packing process may be improved. Furthermore, when base packing material 3 in a continuous belt shape is used, automatic carrying of electronic components may be realized by forming perforations 7 at the edge of base packing material 3 as shown in FIGS. 1A and 1B.

Also, top tape 6 may be color coded for helping to recognize that the contained parts are capacitors. Further, as top tape 6 has the shape of a tape, a recognition code such as multi-color markings and/or bar code markings may be provided on top tape 6 for recognition of the type of the contained capacitors and the contained quantity. Accordingly, visual confirmation and recognition by machine may be performed.

With the structure described above, bodies 1 and lead wires 2 of capacitors 21 are securely positioned and held by body containing portions 4 and lead wire containing portions 5 respectively. Consequently, capacitors 21 may not touch each other, and, as lead wires 2 drawn out from bodies 1 of the capacitors are positioned and held by lead wire containing portions 5, bodies 1 of capacitors 21 may not turn around or move in body containing portions 4. Accordingly, the occurrence of scratches on bodies 1 of the capacitors and deformation of lead wires 2, during a packing process, transport and storage, may be substantially prevented, so that the reliability of the electronic components may be improved.

Also, by using base packing material 3 having the structure described above, capacitors 21 may be easily inserted automatically into base packing material 3 by a machine during the packing process.

Figure 1B:
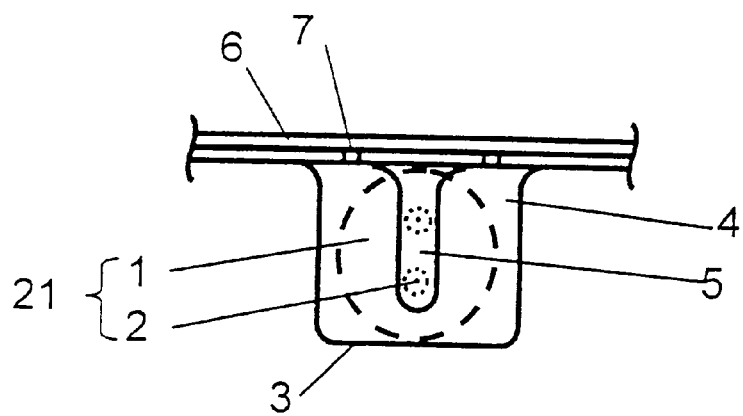
FIG. 1B shows a partial view as directed by an arrow 100 in FIG. 1.

In addition, as shown in FIG. 1A, by adhering top tape 6 in a manner such that at least a portion of body containing portions 4 and a portion of lead wire containing portions 5 are exposed, top tape 6 may be peeled off with relative ease improving the work efficiency of the taking-out process of capacitors 21.

Also, by using resin for base packing material 3 and for top tape 6, top tape 6 may be easily attached to base packing material 3 by thermal welding.

In the following, another exemplary embodiment of the present invention is described referring to FIG. 2. In FIG. 2, body containing portions 9 and lead wire containing portions 10 are formed on a base packing material 8 as in the case of FIG. 1. The difference from FIG. 1 is that lead wire containing portions 10 of FIG. 2 are formed by protruding, in tapered shape, one of the ends of a respective body containing portions 9.

Figure 2:
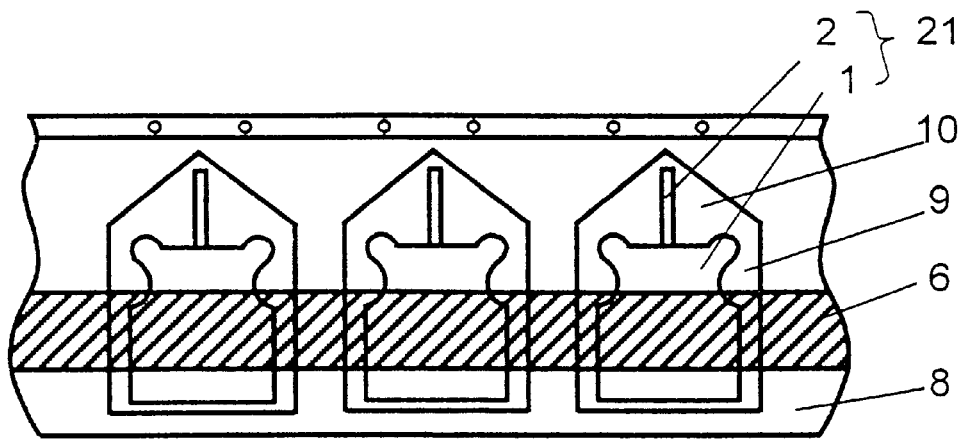
FIG. 2 is a plan view showing a packing system in which capacitors are contained in a other base packing material and a top tape is attached according to the first exemplary embodiment of the present invention.

With the structure of FIG. 2, the positioning and the holding of the lead wires 2 is performed as in the case of FIG. 1. The advantage of the example of FIG. 2 is that the body containing portion side of lead wire containing portion 10 is wider than that of FIG. 1, so that the insertion of capacitor 21 into base packing material 8 may become easier during the packing process.

Second exemplary embodiment

Figure 3:
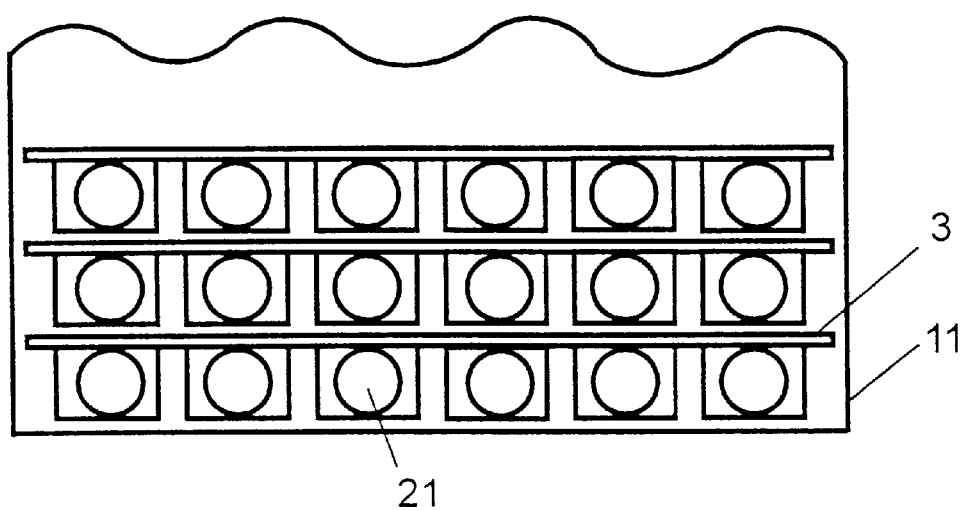
FIG. 3 is a cross sectional front view showing the structure of the packing system of electronic components according to a second exemplary embodiment of the present invention.

In the following, an explanation a second exemplary embodiment of the present invention is described referring to FIG. 3.

A base packing material 3 containing a plurality of capacitors 21, as described in the first exemplary embodiment, may be formed into a strip shape of a predetermined length. Then a plurality of base packing materials 3 in strip shape, containing a predetermined number of capacitors 21, may be laminated and contained in a packing box 11.

With the structure described above, the handling of base packing material 3 containing a predetermined number of capacitors 21, and the counting of the number of capacitors may be facilitated.

Third exemplary embodiment

Figure 4:
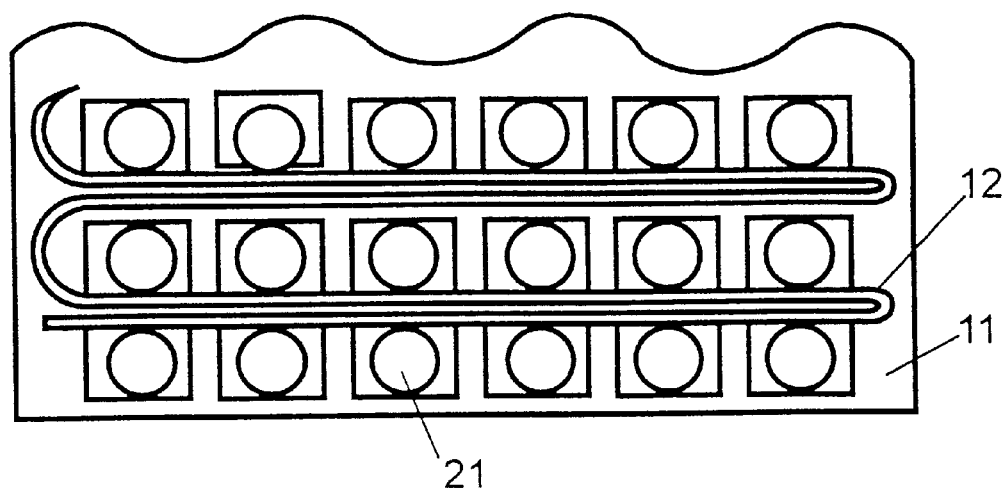
FIG. 4 is a cross sectional front view showing the structure of the packing system of electronic components according to a third exemplary embodiment of the present invention.

In the following, an explanation of a third exemplary embodiment of the present invention is described referring to FIG. 4.

Base packing material 12 containing a plurality of capacitors 21 is folded in zigzag and contained in packing box 11.

With the structure described above, a relatively long base packing material 12 containing a plurality of capacitors 21 folded continuously in zigzag is taken in and out from packing box 11, so that the space for containing capacitors in packing box 11 is effectively used and work efficiency is improved.

Forth exemplary embodiment

Figure 5:
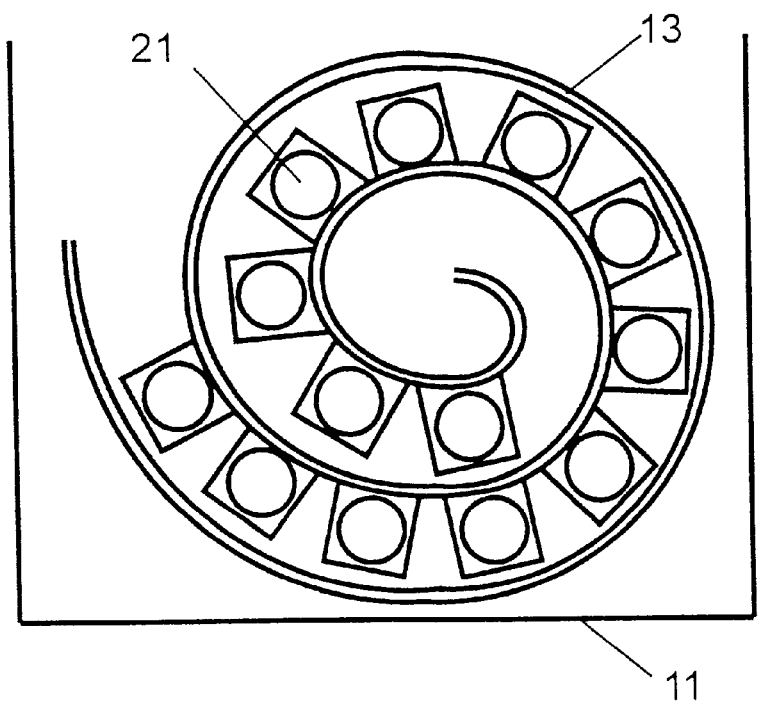
FIG. 5 is a cross sectional front view showing the structure of the packing system of electronic components according to a fourth exemplary embodiment of the present invention.

In the following, an explanation of a fourth exemplary embodiment of the present invention is described referring to FIG. 5.

Base packing material 13 containing a plurality of capacitors 21 may be rolled and contained in packing box 11.

With the structure described above, the handling of the packing system becomes relatively easy. Also, when capacitors 21 are used by a user, automatic feeding of capacitors 21 by using automatic feeding machines becomes relatively easy.

Fifth exemplary embodiment

Figure 6:
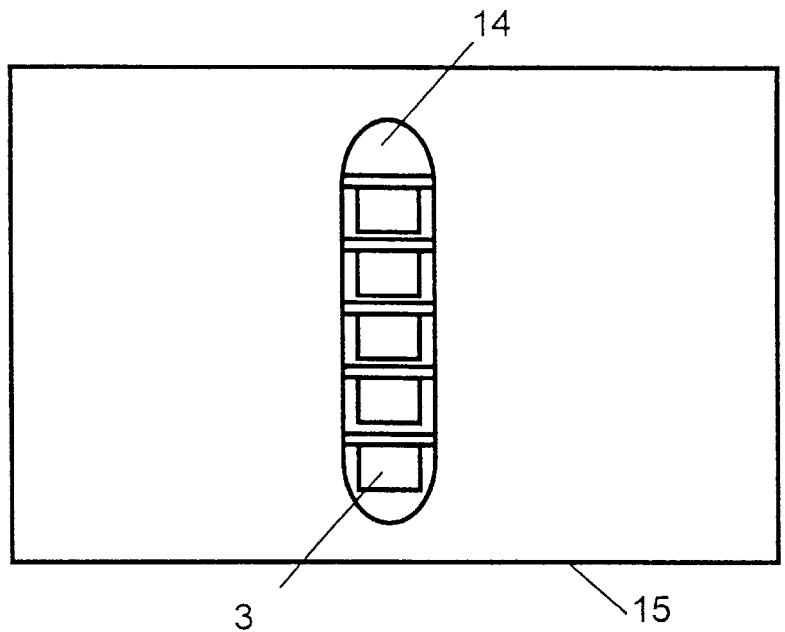
FIG. 6 is a cross sectional front view showing the structure of the packing system of electronic components according to a fifth exemplary embodiment of the present invention.
Figure 7:
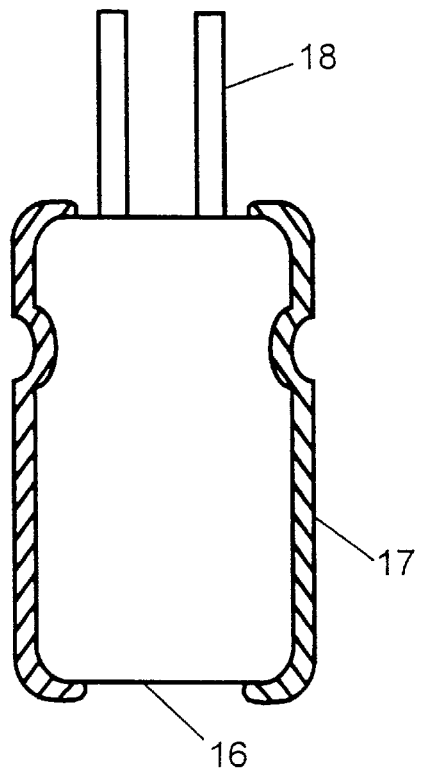
FIG. 7 is a partial cross sectional front view showing a structure of a popular capacitor.
Figure 8:
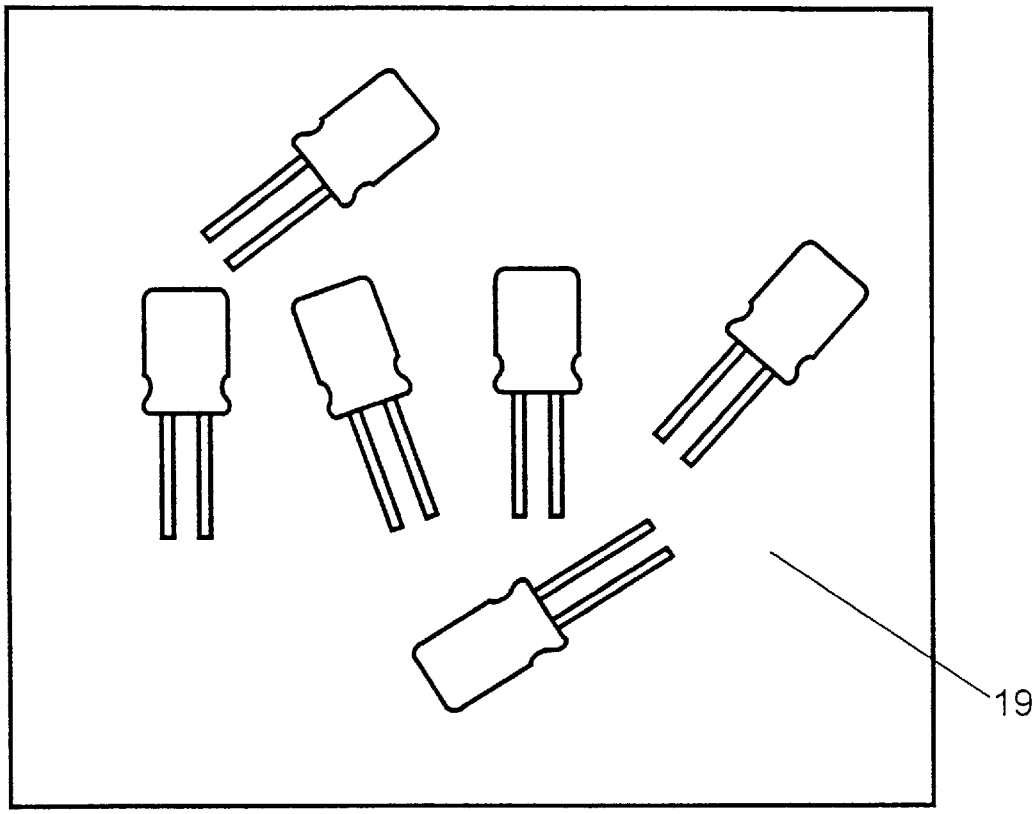
FIG. 8 is a front view illustrates conventional packing of electronic components.

In the following, an explanation of a fifth exemplary embodiment of the present invention is described referring to FIG. 6.

Through a wall of packing box 15, peephole 14 may be provided, so that base packing material 3 is visible from outside of packing box is through peephole 14.

With the structure described above, the state of the base packing material 3 contained in packing box 15 is visually confirmed through peephole 14, from outside of packing box 15. Furthermore, when base packing material 3 is taken out from packing box 15, base packing material 3 may be taken out by pushing base packing material 3 in the direction of a removable portion, with a finger inserted into the packing box 15 through peephole 14.

As described above, the electronic components packing system of the present invention comprises a base packing material provided with body containing portions, for containing the bodies of the electronic components, and lead wire containing portions, respectively formed at the respective body containing portions, for containing the lead wires of the electronic components. A top tape may be attached on the top of the base packing material for covering the electronic components contained in the base packing material. Hence, the bodies of the respective electronic components are positioned and held by the body containing portions formed on the base packing material. Consequently the electronic components may not touch each other, lead wires may not deform, and sheathing sleeves and cases of the electronic components may not be scratched. Furthermore, the lead wires drawn out from the bodies of the electronic components are securely positioned, so that the electronic components may not move in the body containing portion.

Accordingly, highly reliable packing process, transport and storage may be realized.

What is claimed is:

1. A packing system for electronic components comprising:
    (a) a base packing material including
        (i) a plurality of body containing portions for containing bodies of said electronic components, each of said body containing portions have at least one face right-angled to a plane of an array of said plurality of body containing portions and parallel to a direction of an array of said plurality of body containing portions and
        (ii) a plurality of lead wire containing portions, respectively formed at said respective ones of the plurality of body containing portions, for containing lead wires extending from respective bodies of the electronic components; each of said plurality of lead wire containing portions having two opposite walls for containing lead wires in a space therebetween, i) said two opposite walls extend from said body containing portions so that said two opposite walls protrude substantially right-angled to said at least one face right-angled to a plane of an array of said plurality of body containing portions and parallel to a direction of an array of said plurality of body containing portions, or ii) said two opposite walls extend from said body containing portions to intersect and thereby connect with each other, and
    (b) a top tape attached to the top of said base packing material for maintaining the electronic components in said base packing material.

2. The packing system of electronic components according to claim 1, wherein said base packing material is shaped into a continuous belt, and sequentially provided therein at intervals of a predetermined spacing are the plurality of said body containing portions having respective lead wire containing portions.

3. The packing system of electronic components according to claim 2, wherein said base packing material in belt shape is provided with perforations.

4. The packing system of electronic components according to claim 1, wherein said plurality of lead wire containing portions are formed by providing at least one protruded portion at one of the ends of said respective one of the plurality of body containing portions formed on said base packing material.

5. The packing system of electronic components according to claim 1, wherein said plurality of lead wire containing portions are formed by protruding, in taper shape, one of the ends of said respective ones of the plurality of body containing portions formed on said base packing material.

6. The packing system of electronic components according to claim 1, wherein said top tape is provided with at least one of a color and a code for recognition of said electronic components.

7. The packing system of electronic components according to claim 1, wherein said base packing material is made of one of a resin sheet and paper.

8. The packing system of electronic components according to claim 7, wherein said base packing material is made of styrene resin.

9. The packing system of electronic components according to claim 1, wherein said top tape is attached to the top of said base packing material such that at least a portion of each of said plurality of body containing portions and each of said plurality of lead wire containing portions is exposed.

10. The packing system of electronic components according to claim 1, wherein a resin sheet is used for said base packing material, and said top tape which is made of resin is attached by thermal welding on said base packing material.

11. The packing system of electronic components according to claim 2, wherein said continuous belt-shaped base packing material containing said electronic components is rolled and contained in a packing box.

12. The packing system of electronic components according to claim 2, wherein a plurality of said continuous belt-shaped base packing materials of predetermined length containing said electronic components are laminated and contained in a packing box.

13. The packing system of electronic components according to claim 12, wherein a peephole is formed through a wall of the packing box containing said laminated base packing materials.

14. The packing system of electronic components according to claim 2, wherein a plurality of said continuous belt-shaped base packing materials of predetermined length containing said electronic components are contained in a packing box.

15. The packing system of electronic components according to claim 2, wherein said plurality of lead wire containing portions are formed by providing at least one protruded portion at one of the ends of said respective ones of the plurality of body containing portions formed on said base packing material.

16. The packing system of electronic components according to claim 2, wherein said plurality of lead wire containing portions are formed by protruding, in taper shape, one of the ends of said respective ones of the plurality of body containing portions formed on said base packing material.

17. The packing system of electronic components according to claim 2, wherein said top tape is provided with at least one of a color and a code for recognition of said electronic components.

18. The packing system of electronic components according to claim 2, wherein said base packing material is made of one of a resin sheet and paper.

19. The packing system of electronic components according to claim 3, wherein said base packing material is made of one of a resin sheet and paper.

20. The packing system of electronic components according to claim 4, wherein said base packing material is made of one of a resin sheet and paper.

21. The packing system of electronic components according to claim 5, wherein said base packing material is made of one of a resin sheet and paper.

22. The packing system of electronic components according to claim 2, wherein said top tape is attached to the top of said base packing material such that at least a portion of each of said plurality of body containing portions and each of said plurality of lead wire containing portions is exposed.

23. The packing system of electronic components according to claim 3, wherein said top tape is attached to the top of said base packing material such that at least a portion of each of said plurality of body containing portions and each of said plurality of lead wire containing portions is exposed.

24. The packing system of electronic components according to claim 4, wherein said top tape is attached to the top of said base packing material such that at least a portion of each of said plurality of body containing portions and each of said plurality of lead wire containing portions is exposed.

25. The packing system of electronic components according to claim 5, wherein said top tape is attached to the top of said base packing material such that at least a portion of each of said plurality of body containing portions and each of said plurality of lead wire containing portions is exposed.

26. The packing system of electronic components according to claim 6, wherein said top tape is attached to the top of said base packing material such that at least a portion of each of said plurality of body containing portions and each of said plurality of lead wire containing portions is exposed.

27. The packing system of electronic components according to claim 7, wherein said top tape is attached to the top of said base packing material such that at least a portion of each of said plurality of body containing portions and each of said plurality of lead wire containing portions is exposed.

28. The packing system of electronic components according to claim 2, wherein a resin sheet is used for said base packing material, and said top tape which is made of resin is attached by thermal welding on said base packing material.

29. The packing system of electronic components according to claim 3, wherein a resin sheet is used for said base packing material, and said top tape which is made of resin is attached by thermal welding on said base packing material.

30. The packing system of electronic components according to claim 4, wherein a resin sheet is used for said base packing material, and said top tape which is made of resin is attached by thermal welding on said base packing material.

31. The packing system of electronic components according to claim 5, wherein a resin sheet is used for said base packing material, and said top tape which is made of resin is attached by thermal welding on said base packing material.

32. The packing system of electronic components according to claim 6, wherein a resin sheet is used for said base packing material, and said top tape which is made of resin is attached by thermal welding on said base packing material.

33. The packing system of electronic components according to claim 7, wherein a resin sheet is used for said base packing material, and said top tape which is made of resin is attached by thermal welding on said base packing material.

* * * * *